(12) United States Patent
Guddeti et al.

(10) Patent No.: US 10,444,281 B2
(45) Date of Patent: Oct. 15, 2019

(54) MICROCONTROLLER AND METHOD FOR TESTING A MICROCONTROLLER

(71) Applicant: Infineon Technologies AG, Neubiberg (DE)

(72) Inventors: Jayakrishna Guddeti, Bangalore (IN); Deepa Chandran, Thrissur (IN); Shivaprasad Sadashivaiah, Bangalore (IN)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/438,869

(22) Filed: Feb. 22, 2017

(65) Prior Publication Data

US 2017/0248655 A1    Aug. 31, 2017

(30) Foreign Application Priority Data

Feb. 29, 2016    (DE) .................. 10 2016 203 270

(51) Int. Cl.
*G01R 31/3181* (2006.01)
*G01R 31/317* (2006.01)
*G06F 11/263* (2006.01)
*G01R 31/327* (2006.01)

(52) U.S. Cl.
CPC . *G01R 31/31813* (2013.01); *G01R 31/31703* (2013.01); *G06F 11/263* (2013.01)

(58) Field of Classification Search
CPC .......... G01R 31/31813; G01R 31/3183; G01R 31/31915; G01R 31/31703; G01R 31/31937; G06F 11/263
See application file for complete search history.

(56) References Cited

U.S. PATENT DOCUMENTS

| | | | | |
|---|---|---|---|---|
| 5,202,888 A | * | 4/1993 | Ochiai | G11C 29/34 714/703 |
| 5,226,149 A | | 7/1993 | Yoshidaea et al. | |
| 6,295,620 B1 | * | 9/2001 | Togo | G11C 29/36 714/719 |
| 6,445,773 B1 | * | 9/2002 | Liang | H04M 3/30 370/248 |

(Continued)

FOREIGN PATENT DOCUMENTS

WO    2010/023583 A1    3/2010

OTHER PUBLICATIONS

"Test Pattern Generator." JTAG Boundary-Scan Software. Corelis. 1 page.

*Primary Examiner* — April Y Blair
*Assistant Examiner* — Dipakkumar B Gandhi
(74) *Attorney, Agent, or Firm* — Eschweiler & Potashnik, LLC

(57) ABSTRACT

A microcontroller includes a data memory configured to store test signal data. The microcontroller further includes a signal generator configured to process the test signal data in order to provide at least one test signal. The microcontroller also includes a circuit under test configured to process the test signal. The test signal data includes at least one pattern snippet and an associated pattern descriptor. The pattern snippet includes data concerning a content of a part of the test signal. The associated pattern descriptor includes data concerning a pattern formed by the pattern snippet within the test signal.

14 Claims, 7 Drawing Sheets

(56) References Cited

U.S. PATENT DOCUMENTS

| | | |
|---|---|---|
| 6,574,626 B1* | 6/2003 | Regelman .............. G11C 29/56 |
| 2001/0023490 A1 | 9/2001 | Gloeckler et al. |
| 2006/0150042 A1* | 7/2006 | Schuttert ........ G01R 31/318558 |
| | | 714/731 |
| 2008/0019611 A1* | 1/2008 | Larkin .................. G06K 9/6203 |
| | | 382/287 |
| 2008/0235548 A1* | 9/2008 | Yamada ........... G01R 31/31813 |
| | | 714/738 |
| 2009/0300420 A1* | 12/2009 | Aue .................... G06F 11/2236 |
| | | 714/35 |
| 2011/0004793 A1* | 1/2011 | Sul ....................... G11C 29/003 |
| | | 714/718 |
| 2012/0140840 A1* | 6/2012 | Romero ................. H04L 1/244 |
| | | 375/295 |
| 2012/0191400 A1 | 7/2012 | Sontakke et al. |
| 2013/0293242 A1* | 11/2013 | Kohn ....................... G01K 7/16 |
| | | 324/511 |
| 2014/0380110 A1* | 12/2014 | Kim ............... G01R 31/318508 |
| | | 714/726 |
| 2016/0197684 A1* | 7/2016 | Tsai .................. H04B 17/0085 |
| | | 455/67.14 |

* cited by examiner

FIG 5

| Field | Description |
|---|---|
| Snippet offset | Pattern data offset in on-chip memory |
| Snippet size | Size of pattern data (in 32bits) |
| Repeat (yes/no) | Repetition of this snippet |
| Repeat count | Number of times to repeat |
| Interface1 Interleave | Interface data in pattern memory location w.r.t start location |
| Interface2 Interleave | Interface data in pattern memory location w.r.t start location |
| Interface3 Interleave | Interface data in pattern memory location w.r.t start location |
| Interface4 Interleave | Interface data in pattern memory location w.r.t start location |
| Interface5 Interleave | Interface data in pattern memory location w.r.t start location |
| Interface6 Interleave | Interface data in pattern memory location w.r.t start location |
| Interface7 Interleave | Interface data in pattern memory location w.r.t start location |
| Interface8 Interleave | Interface data in pattern memory location w.r.t start location |
| Interface1 Mode and control | PWM/Serializer, Clocking ratio |
| Interface2 Mode and control | PWM/Serializer, Clocking ratio |
| Interface3 Mode and control | PWM/Serializer, Clocking ratio |
| Interface4 Mode and control | PWM/Serializer, Clocking ratio |
| Interface5 Mode and control | PWM/Serializer, Clocking ratio |
| Interface6 Mode and control | PWM/Serializer, Clocking ratio |
| Interface7 Mode and control | PWM/Serializer, Clocking ratio |
| Interface8 Mode and control | PWM/Serializer, Clocking ratio |
| Synchronization bit map1 | Bit map representing synchronous start of different interfaces |
| Synchronization bit map2 | Bit map representing synchronous start of different interfaces |
| Synchronization bit map3 | Bit map representing synchronous start of different interfaces |
| Signal default values | One bit per interface |

| Field | Description |
|---|---|
| Number of descriptors | Number of descriptors in this meta descriptor |
| Repeat (yes/no) | Repetition of the pattern snippets |
| Repeat count | Number of times to repeat |
| Start event | Software triggered, trigger wire |
| Stop event | End of pattern, software triggered, trigger wire |
| Next descriptor pointer | Points to next descriptor in the sequence |
| Descriptor pointer 1 | Pattern descriptor pointer |
| Descriptor pointer 2 | Pattern descriptor pointer |
| Descriptor pointer 3 | Pattern descriptor pointer |
| Descriptor pointer 4 | Pattern descriptor pointer |
| Descriptor pointer 5 | Pattern descriptor pointer |
| Descriptor pointer 6 | Pattern descriptor pointer |
| Descriptor pointer 7 | Pattern descriptor pointer |
| Descriptor pointer 8 | Pattern descriptor pointer |

FIG 7

- Boot microcontroller
- Load descriptors and pattern snippets into SRAM
    - Option 1: Using JTAG (or similar interface)
    - Option 2: Generate patterns on microcontroller
- CPU may optimally configure meta descriptors
    - Can change from test to test to create different stress conditions
- CPU configures on-chip protocol emulator module
    - With start address of meta descriptor
- CPU starts the protocol emulator module
- Waits for done interrupt from protocol emulator module
- Continue to next test

FIG 9

- Read descriptor information from input file
- Read data files for each protocol interface as mentioned in descriptor information
- Encode data into corresponding protocol frame format
- Encode frame format into PWM or Serializer based on descriptor settings
- Encode protocol errors into the PWM/Serializer values
- Calculate required interleaving between different interfaces based on pulse widths and on-chip memory bandwidth
- If interleaving not feasible (incase of high frequency requirements)
    - Report out the possible conflict in interleave and user can alter the inputs (number of interfaces, frequency of transitions, so on)
- Else
    - Prepare pattern snippet for writing into microcontroller's memory
    - Prepare descriptor format for writing into microcontroller's memory

US 10,444,281 B2

MICROCONTROLLER AND METHOD FOR TESTING A MICROCONTROLLER

CROSS REFERENCE TO RELATED APPLICATIONS

This application claims priority to German Application No. 10 2016 203 270.4, filed on Feb. 29, 2016, and incorporated herein by reference in its entirety.

FIELD

This disclosure relates in general to microcontrollers and methods, and more particularly to a microcontroller and a method for testing a microcontroller.

BACKGROUND

For connecting microcontrollers to peripheral devices several protocols are known, e.g., SENT, PSI5, PSI5s, I2S, SPI, ASC, LIN, serial radar LVDS interface. It is also known that microcontrollers compromise for the implemented protocols one or more protocol IP modules. In order to test the IP modules either during production or, for example, under extreme temperature conditions (so called reliability testing), the testing infrastructure uses either internal loopback mechanism (if supported by the respective IP module) or some sort of waveform generator generating basic protocol frames. The created protocol frames are usually limited with respect to their scope.

Another aspect of microcontroller's functionality are safety mechanisms for detecting protocol errors (CRC/parity error, framing error, encoding error, etc) in data signals. The safety mechanisms are to be checked during the production of the microcontrollers and even customers need to check the safety mechanisms in a startup phase before enabling safety features on the microcontroller. For testing the safety mechanisms, it is known to use external components for submitting erroneous signals to the microcontroller. This is hardly a feasible option for the end user.

SUMMARY

In an embodiment, a microcontroller comprises a data memory configured for storing test signal data. The microcontroller further comprises a signal generator configured for processing the test signal data in order to provide at least one test signal. The microcontroller also comprises at least one circuit under test configured for processing the test signal. The test signal data comprises at least one pattern snippet and at least one pattern descriptor associated with the pattern snippet. The pattern snippet comprises data concerning a content of a part of the test signal and the associated pattern descriptor comprises data concerning a pattern formed by the pattern snippet within the test signal.

In a different embodiment, a method for testing a microcontroller comprises generating at least one test signal. The test signal is generated by a signal generator comprised by the microcontroller and is generated using test signal data. The method further comprises submitting the test signal to a circuit under test comprised by the microcontroller. The method also comprises evaluating a response of the circuit under test to the test signal. The test signal data comprises at least one pattern snippet and at least one pattern descriptor associated with the pattern snippet. The pattern snippet comprises data concerning a content of a part of the test signal and the associated pattern descriptor comprises data concerning a pattern formed by the pattern snippet within the test signal.

The details of one or more embodiments are set forth in the accompanying drawings and the description below. Other features, objects, and advantages will be apparent for the description and drawings, and from the claims.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 5 shows an embodiment of a pattern descriptor format.

FIG. 6 illustrates an embodiment of a meta descriptor format.

FIG. 7 illustrates an embodiment of a test sequence.

FIG. 9 shows an embodiment of converting a test signal into test signal data.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the disclosure, and do not limit the scope.

Figure 1:
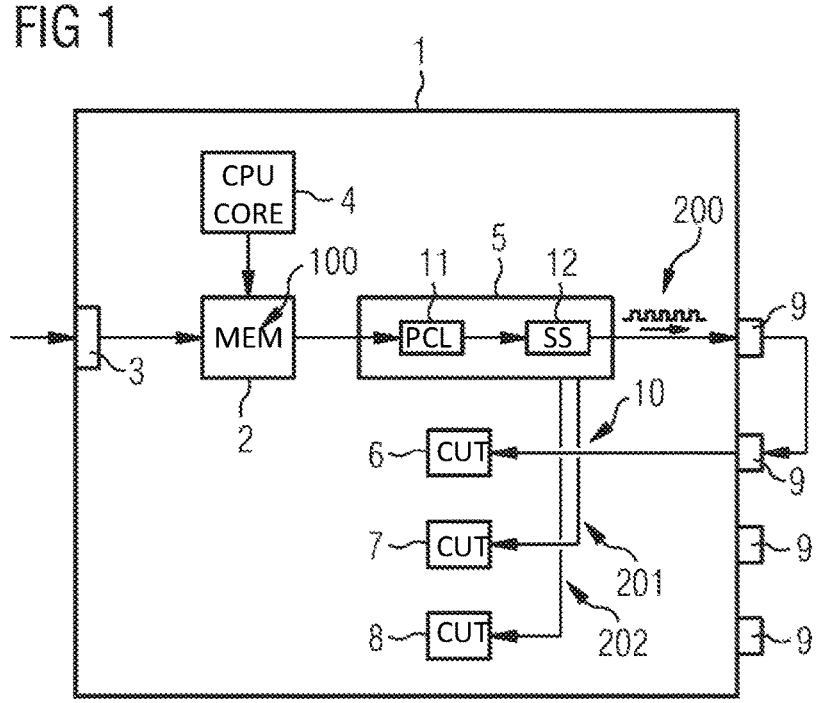
FIG. 1 shows a schematic embodiment of a microprocessor.

FIG. 1 illustrates an embodiment of a microcontroller 1. Such a microcontroller, for example, may be used for automobiles. The microcontroller 1 comprises a data memory 2 which is configured for storing test signal data 100 and which is an on-chip or built-in memory. The test signal data 100 are used for testing the microcontroller 1 leading to a self-test of the microcontroller 1. This implies that for testing the microcontroller 1 external components producing test signals and providing the microcontroller 1 with such test signals are not necessary. In the shown embodiment, the data memory 2 can be accessed by a CPU core 4 and by a data interface 3. The data interface 3 is configured for inputting the test signal data into the data memory 2 and is here, for example, a JTAG (Joint Test Action Group) (debug) interface.

The microcontroller 1 further comprises a signal generator 5 which is configured for processing the test signal data 100 stored by the data memory 2 and which is connected to the data memory 2 via an interface with a configurable data width. The width of the, for example, bus from the data memory 2 to the signal generator 5 determines the number of circuits under test supplied with test signals in parallel and determines the frequency of the respective protocols. The processing of the test signal data 100 by the signal generator 5 is done in order to provide in the shown embodiment the plurality of test signals 200, 201, 202. The test signal 200 in the shown example is a pulse width modulated (PWM)-signal. The signal generator 5 generates test signals (in one embodiment these signals are protocol frames) accordingly to different data protocols. In the embodiment, one test signal 200 is submitted to an interface 9 serving here as input/output interface. In the shown embodiment, the interfaces 9 are pins or pads. The test signal 200 in form of a PWM-signal reaches the circuit under test 6 via an external loop and via two interfaces 9. Such an external loopback still enables to test the microcontroller 1 in a single chip mode (which is required for robustness and EMC validation) and enables to test pins/pads as examples for interfaces 9 and transceivers along with the digital logic (here represented by the circuits under test (CUT) 6, 7, 8) comprised by the microcontroller 1. The remaining two test signals 201, 202 are directly and via an internal loopback 10 submitted to two circuits under test 7, 8. This transmission mode avoids using external loopback and concentrates on testing the digital logic within the microcontroller 1.

The test signals 200, 201, 202 submitted to the plurality of circuits under test 6, 7, 8 (which are in one embodiment IP modules) are provided by the signal generator 5 based on data within the test signal data 100 (especially the meta descriptor) describing a relationship between the plurality of test signals 200, 201, 202. This refers e.g. to the timing or synchronization of the test signals 200, 201, 202 or to the used bandwidth etc. The usage of more than one circuit under test 6, 7, 8 is required by some data protocols, e.g. data and clock lines or serial radar with interface for data, frame and clock etc. Due to the test signal data 100 and the enclosed information it is also possible to provide a guaranteed bandwidth for each circuit under test 6, 7, 8 while submitting test signals 200, 201, 202 to multiple circuits under test 6, 7, 8 simultaneously. In one embodiment, this is based on using an offline pattern analyzer to match the available bandwidth.

The three circuits under test 6, 7, 8 are configured for processing the test signals 200, 201, 202 and are in the shown example three different IP modules for handling signals based on different data communication protocols. The circuits under test 6, 7, 8 receive the test signals 200, 201, 202 and process them. The shown circuits under test 6, 7, 8 are processing only signals—or protocol frames—according to a specific data communication protocol. Therefore, based on data comprised by the test signal data 100, the test signals 200, 201, 202 are provided by the signal generator 5 accordingly to the respective data communication protocol. The reaction of the circuits under test 6, 7, 8, i.e. whether they detect the induced errors within the test signals 200, 201, 202 allows to test the microcontroller 1. This response of the circuits under test 6, 7, 8 to the test signals 200, 201, 202 is accordingly evaluated and allows to test the reliability of the circuits under test 6, 7, 8 and, accordingly, of the microcontroller 1 as such.

The signal generator 5 comprises a pattern control logic (PCL) 11 and a signal source (SS) 12. The pattern control logic 11 receives the test signal data 100 and controls the signal source 12 based on the test signal data 100. The signal source 12 in the shown embodiment actually provides the physical test signals 200, 201, 202. The signal source 12 is in one embodiment configured for using pulse width modulation for providing the test signal 200, 201, 202. Pulse-width modulation (PWM) or pulse-duration modulation (PDM) is known as a modulation technique for encoding a message into a pulsing signal. In a different embodiment, the signal source 12 is configured for using serialization for providing the test signals 200, 201, 202. Serialization is the process of translating data structures or object state into a format that can be stored and reconstructed later in the same or another computer environment.

Testing the microcontroller is in one embodiment part of a startup test to ensure that safety checks are working properly before enabling the safety features after starting the microcontroller. Protocol errors are encoded as part of pattern while creating for example PWM values for the protocol frames. Some errors, for example, are CRC/Parity error, framing error, encoding error, etc. Especially, this testing can be done e.g. without the need for external machinery (or external slave devices) submitting protocol errors to the circuits under test 6, 7, 8 as parts of the microcontroller 1.

Figure 2:
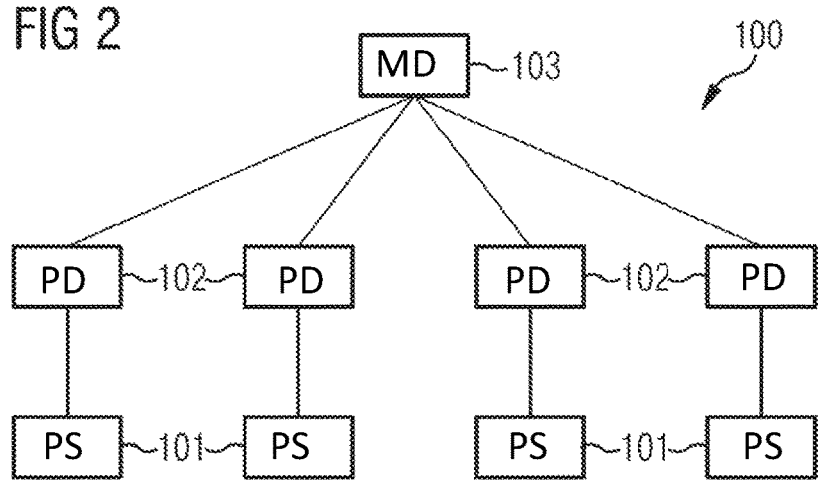
FIG. 2 illustrates an embodiment of a hierarchy within a test signal data.

FIG. 2 illustrates one embodiment of the hierarchy within the test signal data 100 comprising in this example four pattern snippets (PS) 101, four associated pattern descriptors (PD) 102 and just one single meta descriptor (MD) 103. The shown hierarchy has two different levels of elements for describing the structure of the test signals to be generated. The description of a content of the test signals to be provided is given by the pattern snippets 101. Each associated pattern descriptor 102 comprises data concerning a pattern formed by the pattern snippet 101 within the test signal. The pattern descriptors 102, for example, describe how or in which kind and how often the associated pattern snippet 101 is present in the test signal while forming the pattern. The individual patterns are further combined via the data comprised by the meta descriptor 103 describing how or how often the patterns of the pattern snippets are present within the test signal to be provided by the signal generator. If more than one test signal is to be generated by the signal generator, then the meta descriptor 103 also comprises the necessary data concerning the presence of the patterns within the test signals. The meta descriptor 103 allows to generate long and complex test signals while reducing the amount of data used for the description. Hence, even a small memory or storage space can be sufficient for complex test signals.

The form of the test signal data 100 allows a description even of complex or long structures within the test signals in a very compact way. Further, using patterns within the test signals helps to ease generating the actual test signal by allowing to re-use content parts of the test signals. The data structure allows to simulate stress conditions, different protocol conditions or different traffic patterns. The test signal data also allows to combine multiple patterns into one longer pattern, to repeat patterns or even entire test signals, to synchronize multiple signal sources to create bus protocols and so on. Especially, multiple circuits under test can be tested simultaneously. As the test signal data—while even describing longer structures of test signals—are very compact, a small data memory is sufficient and it is possible to use conventional on-chip memory.

In one embodiment, the test signal data are generated before the actual test of the microcontroller happens by converting necessary protocol frames, preferably containing errors, into the format used by the described test signal data. Such generating of test signal data comprises identifying content elements within signals to be generated as test signals and assigning them to pattern snippets. Further, patterns formed by such content elements described by the pattern snippets are to be identified and appropriate pattern descriptors are to be generated. In one embodiment, a meta descriptor is generated for a combination of different patters formed by the different pattern snippets.

The test signal data also allows in one embodiment to provide test signals for various circuits under test with a guaranteed bandwidth and correctness of patterns within the test signals. Further, in one embodiment, the test signal data comprises data for synchronizing test signals for multi bit circuits under test.

Figure 3:
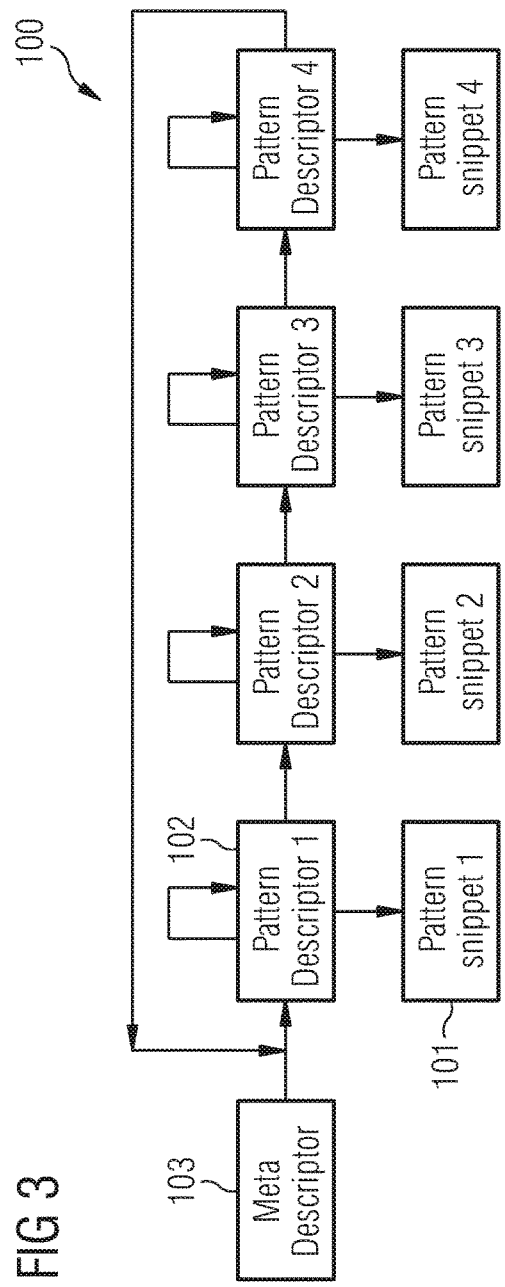
FIG. 3 illustrates an embodiment of the usage of the test signal data.
Figure 4:
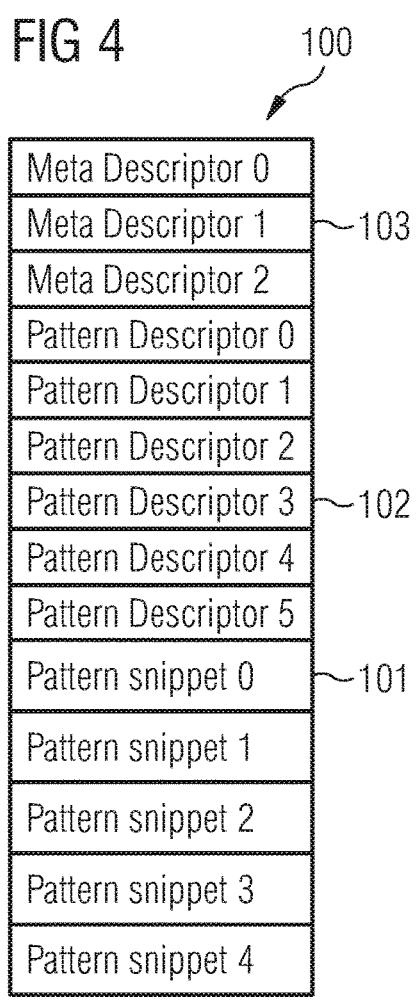
FIG. 4 shows an embodiment of the arrangement of the test signal data in a data memory.

FIG. 3 shows how the pattern snippets 101, the associated pattern descriptors 102 and the meta descriptor 103 are used and are interacting with each other. FIG. 3 shows an example of an execution sequence applied by the signal generator. The data memory comprises the test signals data with meta descriptor 103, pattern descriptors 102 and associated pattern snippets 101 at the start of a test of a microcontroller. The signal generator receives a base address of the meta descriptor 103. The pattern control logic reads the meta descriptor 103 and receives the first pattern descriptor 101 (here named: "Pattern Descriptor 1"). From the "Pattern Descriptor 1", the starting offset of the associated pattern snippet 101 (here named: "Pattern snippet 1") is retrieved. Then, the pattern control logic loads a starting address of "Pattern snippet 1" into a base address register located in an address generator unit (not shown here) which generates sequential addresses to the data memory to read the data and to give them to the signal generator. The signal generator receives the data and starts at least one signal source (e.g. PWM or serializer units) which generates one or more protocol frames as test signals.

The pattern descriptors allow to arrange the contents of the test signals defined by the pattern snippets into patterns which are arranged in even longer patterns using the meta descriptors 103. Hence, the meta descriptors 103 allow to repeat the patterns and even to connect or combine multiple meta descriptors. Multiple meta descriptors are in one embodiment sequenced using a linked list of the meta descriptors. This allows to create different sequences in different test runs as, e.g. each run starts with a different meta descriptor. In one embodiment, a meta descriptor refers to up to eight pattern descriptors which are read by the signal generator. The pattern snippets 101 have in one embodiment variable sizes. The pattern snippets 101 are used depending on the required test for one or different test signals. Further, in one embodiment, the pattern snippets 101 are to be used for different test signals even according to different data protocols. In one embodiment, the pattern snippets 101 comprise data as values for a pulse width modulation or for a serializer in order to generate the test signal.

FIG. 5 shows the data content of an embodiment of a pattern descriptor 102. The shown pattern descriptor 102 identifies a pattern snippet within the data memory and the size in number of entries in data memory. Further, there is the data about the number of times the pattern snippet is repeated. The pattern descriptor 102 also comprises the number of circuits under test the particular pattern snippet supports, which can range in one embodiment from one to eight. The pattern descriptor 102 also identifies interleaving of PWM/serializer values in pattern snippet for each protocol interface based on the interleaving data provided by the pattern snippet. Further, the pattern descriptor 102 defines whether to use e.g. PWM or serialization for generating the signal data, i.e. the choice between the different signal sources. This implies in one embodiment the definition of the clock ratio for each circuit under test. In-order to support bus protocols (as one example for multi bit protocols), the pattern descriptor 102 supports synchronization bit map which identifies different circuits under test to be synchronized at the starting point.

FIG. 6 shows the data of an embodiment of a meta descriptor 103. The meta descriptor 103 defines start and stop event for triggering the test. Further, the meta descriptor 103 refers to the pattern descriptors and their arrangements.

FIG. 7 illustrates an embodiment of a sequence of test execution. Once the microcontroller is booted, using e.g. the described JTAG or any similar interface, the test signal data is loaded into the on-chip data memory, e.g. into the RAM. Depending on the current situation, the CPU core configures or changes, for example, any of the meta descriptors to create different protocol frame sequences. This is in one embodiment done from one test to the other. In this embodiment, the CPU core also configures the on-chip signal generator serving as a protocol emulator with base address of the first meta descriptor comprised by the test signal data and starts the signal generator. Following this, the CPU core waits for a done signal or an interrupt or a specified status from the signal generator and continues with the next test. During the test, the response of the circuits under test to the test signals is evaluated for testing their reliability.

Figure 8:
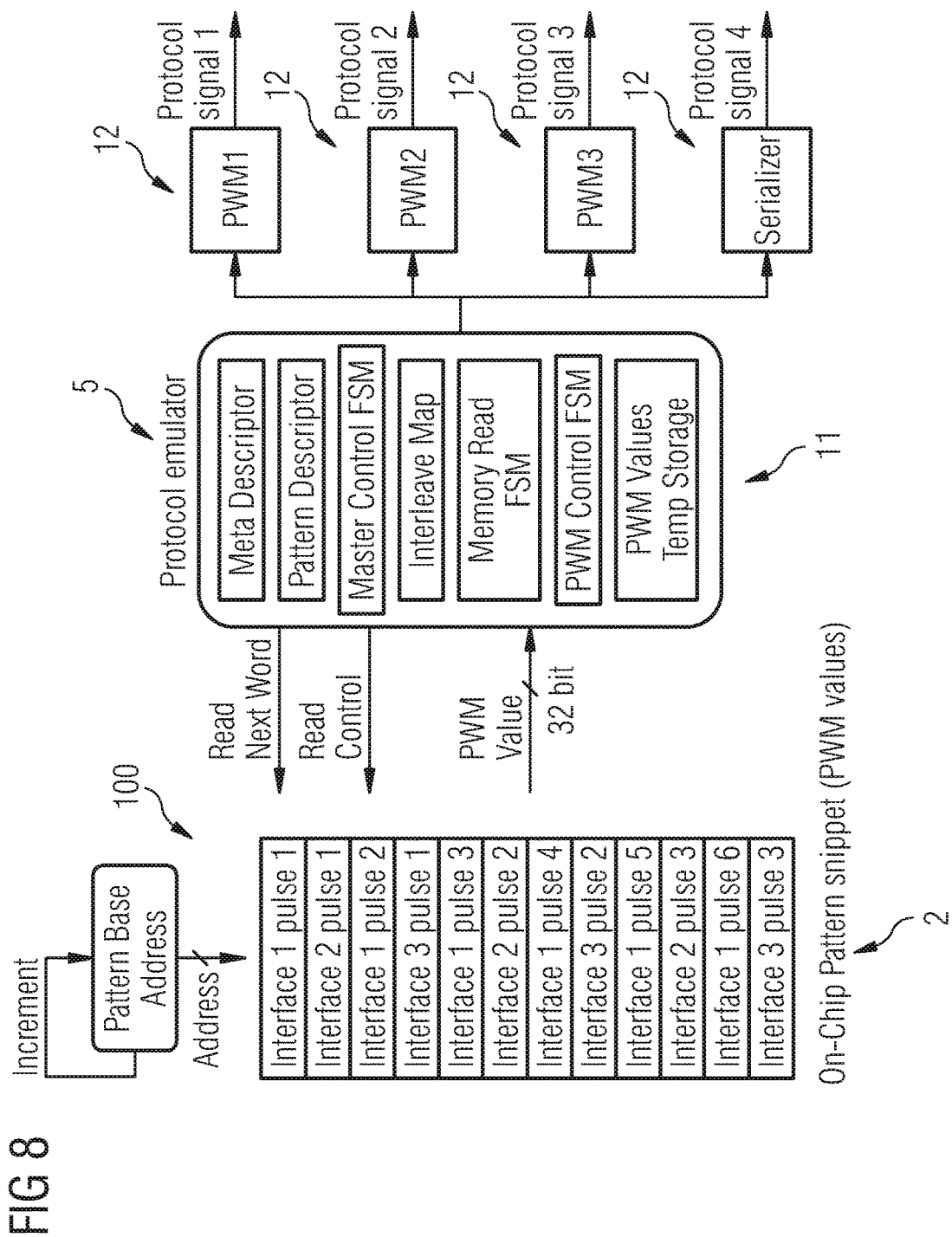
FIG. 8 shows an embodiment of an interaction between the test signal data and the microprocessor.

FIG. 8 illustrates details of the signal generator 5 and the interaction with the data memory 2. As described above, the pattern snippets comprise multiple PWM or serializer values for different protocol interfaces with a particular interleave sequence. The interleaving information is provided to the signal generator 5 as part of the pattern descriptor which tells which location of pattern snippet belongs with which protocol interface. The signal generator identifies the individual pulse values and provides these values to the corresponding signal source 12. The signal sources 12 in the shown embodiment are PWM or Serializer modules. The outputs of the signal sources 12 are connected to the circuits under test.

The signal generator has a temporary storage to store current meta descriptor and pattern descriptor values. Further, temporary storage is used to store at least one immediate next set of PWM/serializer values to avoid gaps in frames when moving from PWM value to next value. The PWMs used in this implementation can be simple counter based PWM, those take pulse width and duty cycle as input create one pulse (with high and low duration). Typical protocol is modelled using sequence of PWM pulses. To emulate high speed serial interfaces, serializers are preferred. Serializer takes 32 bit value from the data memory and creates serial signal by shifting out one bit per clock (or based on clock ratio) to create different width pulses.

The shown signal generator 5 comprises a plurality of signal sources 12 which are used in one embodiment to generate a plurality of test signals. Therefore, the test signal data 100 comprises data concerning a relationship between the signal sources 12 of the plurality of signal sources 12. This relationship especially refers to a bandwidth division between the signal sources 12. In one embodiment the test signal data 100 are such set that the number of test signals provided is optimized. It is also possible to drive high speed circuits under test, to repeat snippets of patterns, to prepare lists of snippets per data communication protocol and to create sequences of patterns. In an embodiment, control events are set which provoke a start or a stop of a test signal.

FIG. 9 shows an embodiment of an algorithm used to create PWM/serializer values and to pack multiple circuit under test frames into pattern snippets based on the bandwidth availability and the frequency of each circuit under test. The algorithm is run offline before starting the test of the microcontroller and takes various parameters, like protocol information, baud rate, number of circuits under test and so on as inputs. The algorithm reads the frame data for each circuit under test and encodes the frame format into a PWM/serializer format. While packing multiple circuits under test into one pattern snippet, the algorithm informs about the case when a bandwidth is not sufficient for a given combination of circuit under test. This allows a user to change the parameters for fitting the pattern into the pattern snippet.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

As the description refers to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

The invention claimed is:

1. A microcontroller, comprising:
   a data memory configured to store test signal data,
   a signal generator configured to process the test signal data in order to provide at least one test signal, and
   at least one circuit under test configured to process the test signal,
   wherein the test signal data comprises at least one pattern snippet and at least one pattern descriptor associated with the pattern snippet,
   wherein the pattern snippet comprises data concerning a content of a part of the test signal, and
   wherein the associated pattern descriptor comprises data that describes a pattern of an associated pattern snippet in a part of the test signal;
   at least one meta descriptor that comprises data that describes a pattern of one or more pattern descriptors.

2. The microcontroller of claim 1, wherein the microcontroller comprises a plurality of circuits under test, wherein the signal generator is configured to provide the plurality of circuits under test with a plurality of test signals, wherein the test signal data comprises a plurality of pattern snippets and associated pattern descriptors and at least one meta descriptor.

3. The microcontroller of claim 1, wherein the microcontroller comprises a plurality of circuits under test, wherein the signal generator is configured to provide the plurality of circuits under test with a plurality of test signals and wherein the test signal data provide information about at least one of a respective bandwidth of and a pattern within the test signals.

4. The microcontroller of claim 1, wherein the signal generator is configured to provide at least one circuit under test with at least one test signal via an internal loopback within the microcontroller.

5. The microcontroller of claim 1, wherein the signal generator is configured to provide at least one circuit under test with at least one test signal via at least one signal interface.

6. The microcontroller of claim 1, wherein at least one circuit under test is configured to process only signals according to a data communication protocol, and wherein the test signal data comprises data for providing at least one test signal according to the data communication protocol.

7. The microcontroller of claim 6, wherein the test signal data comprises data allowing the signal generator to generate test signals for at least one multibit circuit under test.

8. The microcontroller of claim 1, wherein the signal generator comprises a pattern control logic and at least one signal source, wherein the pattern control logic controls the signal source based on the test signal data, and wherein the signal source provides the at least one test signal.

9. The microcontroller of claim 8, wherein the signal generator comprises a plurality of signal sources, wherein the test signal data comprises data concerning a relationship between the signal sources of the plurality of signal sources.

10. The microcontroller of claim 9, wherein the pattern control logic is configured to control the plurality of signal sources so that the signal sources of the plurality of signal sources provide test signals with a guaranteed bandwidth division between the signal sources of the plurality of signal sources.

11. The microcontroller of claim 8, wherein at least one signal source is configured to use pulse width modulation for providing the at least one test signal.

12. The microcontroller of claim 8, wherein at least one signal source is configured to use serialization for providing the at least one test signal.

13. The microcontroller of claim 1, wherein the microcontroller comprises at least one data interface configured to input the test signal data into the data memory.

14. A method for testing a microcontroller, comprising:
   generating at least one test signal by a signal generator comprised by the microcontroller using test signal data,
   submitting the test signal to a circuit under test comprised by the microcontroller, and
   evaluating a response of the circuit under test to the test signal, wherein the test signal data comprises at least one pattern snippet and at least one pattern descriptor associated with the pattern snippet,
   wherein the pattern snippet comprises data concerning a content of a part of the test signal, and
   wherein the associated pattern descriptor comprises data that describes a pattern of an associated pattern snippet in a part of the test signal, and
   wherein at least one meta descriptor comprises data that describes a pattern of one or more pattern descriptors.

* * * * *